United States Patent
Adusumilli et al.

(10) Patent No.: US 10,170,360 B2
(45) Date of Patent: Jan. 1, 2019

(54) REFLOW ENHANCEMENT LAYER FOR METALLIZATION STRUCTURES

(71) Applicant: International Business Machines Corporation, Armonk, NY (US)

(72) Inventors: Praneet Adusumilli, Albany, NY (US); Alexander Reznicek, Troy, NY (US); Oscar van der Straten, Guilderland Center, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/794,576

(22) Filed: Oct. 26, 2017

(65) Prior Publication Data

US 2018/0047625 A1 Feb. 15, 2018

Related U.S. Application Data

(62) Division of application No. 15/189,749, filed on Jun. 22, 2016, now Pat. No. 9,842,770.

(51) Int. Cl.
| | |
|---|---|
| H01L 21/44 | (2006.01) |
| H01L 29/40 | (2006.01) |
| H01L 21/768 | (2006.01) |
| H01L 23/532 | (2006.01) |

(52) U.S. Cl.
CPC .. H01L 21/76882 (2013.01); H01L 21/76864 (2013.01); H01L 21/76883 (2013.01); H01L 23/53209 (2013.01); H01L 23/53266 (2013.01)

(58) Field of Classification Search
CPC .................................................. H01L 21/76882
USPC ........................................... 257/774; 438/675
See application file for complete search history.

(56) References Cited

U.S. PATENT DOCUMENTS

| | | |
|---|---|---|
| 5,789,317 A | 8/1998 | Batra et al. |
| 6,559,917 B2 | 5/2003 | Ikeno |
| 7,405,154 B2 | 7/2008 | Cabral, Jr. et al. |
| 7,795,115 B2 | 9/2010 | Kameyama et al. |
| 7,851,357 B2 | 12/2010 | Cabral, Jr. et al. |
| 8,089,157 B2 | 1/2012 | Cabral, Jr. et al. |
| 8,513,112 B2 | 8/2013 | Ahn et al. |
| 8,592,306 B2 | 11/2013 | Yang et al. |
| 8,691,687 B2 | 4/2014 | Kelly et al. |
| 8,698,318 B2 | 4/2014 | Kelly et al. |
| 8,884,440 B2 * | 11/2014 | Kim .................. H01L 21/76898 257/621 |
| 9,741,577 B2 * | 8/2017 | Li ........................ H01L 21/2855 |
| 9,842,770 B1 * | 12/2017 | Adusumilli ....... H01L 21/76883 257/774 |
| 2015/0203961 A1 | 7/2015 | Ha et al. |
| 2015/0318243 A1 | 11/2015 | Lin et al. |

OTHER PUBLICATIONS

List of IBM Patents or Patent Applications Treated as Related Dated Oct. 26, 2017, 2 Pages.

* cited by examiner

*Primary Examiner* — Calvin Lee
(74) *Attorney, Agent, or Firm* — Scully, Scott, Murphy & Presser, P.C.; Daniel P. Morris, Esq.

(57) ABSTRACT

A reflow enhancement layer is formed in an opening prior to forming and reflowing a contact metal or metal alloy. The reflow enhancement layer facilitates the movement (i.e., flow) of the contact metal or metal alloy during a reflow anneal process such that a void-free metallization structure of the contact metal or metal alloy is provided.

20 Claims, 5 Drawing Sheets

REFLOW ENHANCEMENT LAYER FOR METALLIZATION STRUCTURES

This application is a divisional of U.S. patent application Ser. No. 15/189,749, filed on Jun. 22, 2016, now U.S. Pat. No. 9,842,770 issued Dec. 17, 2017, the disclosure of which is incorporated in its entirety by reference.

BACKGROUND

The present application relates to a semiconductor structure and a method of forming the same. More particularly, the present application relates to a semiconductor structure in which a void-free metallization structure is located on a surface of a reflow enhancement layer and a method of forming such a semiconductor structure.

As the dimensions of semiconductor devices including, for example, middle-of-the-line (MOL) contacts, are scaled down, the currently used tungsten (W) metallization scheme will not be able to meet the resistance targets for future technology nodes. This high resistance for tungsten is a result of the need for utilizing thick diffusion barrier liners and poor tungsten gap fill.

Cobalt (Co) provides an alternative to tungsten fill for MOL contacts, and is typically performed by chemical vapor deposition (CVD) to fill the groundrule features followed by a physical vapor deposition (PVD) to remove cobalt overburden. A high temperature anneal is then applied to reduce seams in the cobalt.

Due to the need for this high temperature anneal, voids in cobalt can migrate to the bottom of the features, and cause very high contact resistance or openings. There is thus a need for providing cobalt contacts (and other metallic contacts) that avoids the migration of the metallic material to the bottom of the features and thus lowers the contact resistance of the structure.

SUMMARY

A reflow enhancement layer is formed in an opening prior to forming and reflowing a contact metal or metal alloy. The reflow enhancement layer facilitates the movement (i.e., flow) of the contact metal or metal alloy during a reflow anneal process such that a void-free metallization structure of the metal or metal alloy is provided.

In one aspect of the present application, a semiconductor structure including a void-free metallization structure and a reflow enhancement liner is provided. In one embodiment of the present application, the semiconductor structure includes a reflow enhancement liner located in at least a portion of an opening present in a dielectric-containing substrate, the reflow enhancement liner has a horizontal portion and two vertical portions extending from opposite ends of the horizontal portion. A metallization structure is located on the horizontal portion of the reflow enhancement liner and completely fills a volume located between the two vertical portions of the reflow enhancement liner.

In another aspect of the present application, a method of forming a semiconductor structure including a void-free metallization structure and a reflow enhancement liner is provided. In one embodiment of the present application, the method includes providing an opening in a dielectric-containing substrate. Next, a reflow enhancement layer is formed in the opening and atop the dielectric-containing substrate. A layer of a contact metal or metal alloy is then formed on the reflow enhancement layer. Next, a reflow anneal is performed to completely fill a remaining volume of the opening with the contact metal or metal alloy of the layer of contact metal or metal alloy. After the reflow anneal, the layer of contact metal or metal alloy, and the reflow enhancement layer that are located outside of the opening are removed. A portion of the layer of contact metal or metal alloy, and a portion of the reflow enhancement layer remain within the opening after the removal process.

DETAILED DESCRIPTION

Figure 1:
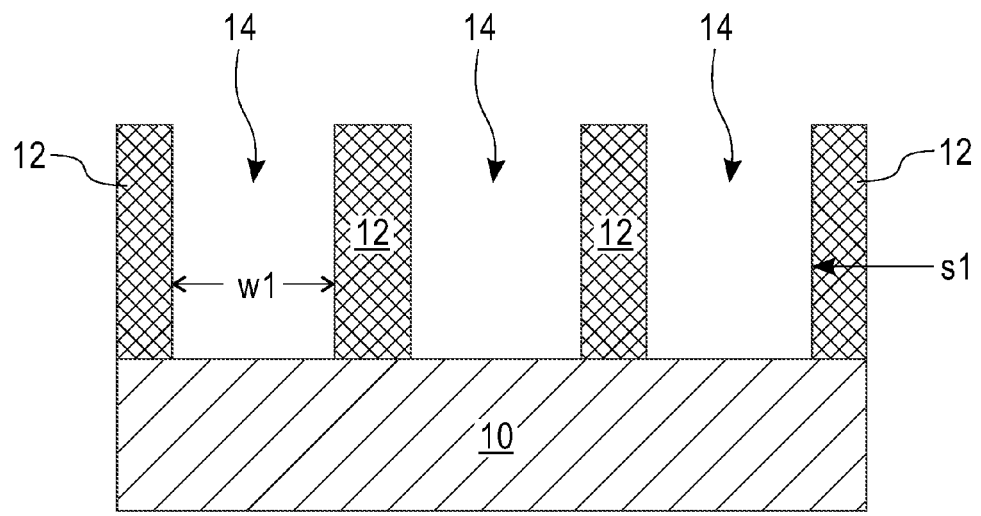
FIG. 1 is a cross sectional view of an exemplary semiconductor structure including a plurality of openings formed in a middle-of-the-line (MOL) dielectric material layer, the openings having vertical sidewalls and a constant width.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary semiconductor structure including a plurality of openings 14 formed in a middle-of-the-line (MOL) dielectric material layer 12, the openings 14 having vertical sidewalls, s1, and a constant width, w1. In this embodiment of the present application, the MOL dielectric material layer 12 is formed on a surface of a substrate 10. The substrate 10 may include a semiconductor substrate such as, for example, silicon, containing one or more semiconductor devices, i.e., transistors, formed thereon. The one or more semiconductor devices are not shown but would be located on a surface of substrate 10 and would be embedded within some portions of the MOL dielectric material layer 12. Although a plurality of openings 14 is described and illustrated, the present application works when a single opening 14 is formed into the MOL dielectric material layer 12.

In some embodiments of the present application, each opening 14 can extend entirely though the MOL dielectric material layer 12 and expose a portion of the substrate 10. In some embodiments, the exposed portion of the substrate 10 represents a source/drain region of a transistor.

In one embodiment of the present application, the substrate 10 is first provided and then the one or more semiconductor devices are formed thereon. The MOL dielectric material layer 12 is then formed. In other embodiments, sacrificial structures are formed on the surface of the substrate 10 and then the MOL dielectric material layer 12 is formed. After forming the MOL dielectric material layer 12, the sacrificial structure may be replaced with a functional semiconductor device.

In some embodiments, the MOL dielectric material layer 12 may be composed of, for example, silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as the MOL dielectric material layer 12. The use of a self-planarizing dielectric material as MOL dielectric material layer 12 may avoid the need to perform a subsequent planarizing step.

In one embodiment, the MOL dielectric material layer 12 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as MOL dielectric material layer 12, a planarization process or an etch back process follows the deposition of the dielectric material. The thickness of the MOL dielectric material layer 12 that can be employed in the present application may vary depending on the type of dielectric material employed as well as the method that was employed in forming the same. In one embodiment, the MOL dielectric material layer 12 has a thickness from 80 nm to 100 nm. Other thicknesses that are greater or lesser than the range provided above can also be used for the MOL dielectric material layer 12.

The at least one opening 14 that is formed into the MOL dielectric material layer 12 can be formed utilizing a patterning process. In one embodiment, the patterning process may include lithography and etching. The lithographic process includes forming a photoresist (not shown) atop the MOL dielectric material layer 12, exposing the photoresist to a desired pattern of radiation and developing the exposed photoresist utilizing a conventional resist developer. The photoresist may be a positive-tone photoresist, a negative-tone photoresist or a hybrid-tone photoresist. The etching process includes a dry etching process (such as, for example, reactive ion etching, ion beam etching, plasma etching or laser ablation), and/or a wet chemical etching process. Typically, reactive ion etching is used in providing the at least one opening 14.

Figure 2:
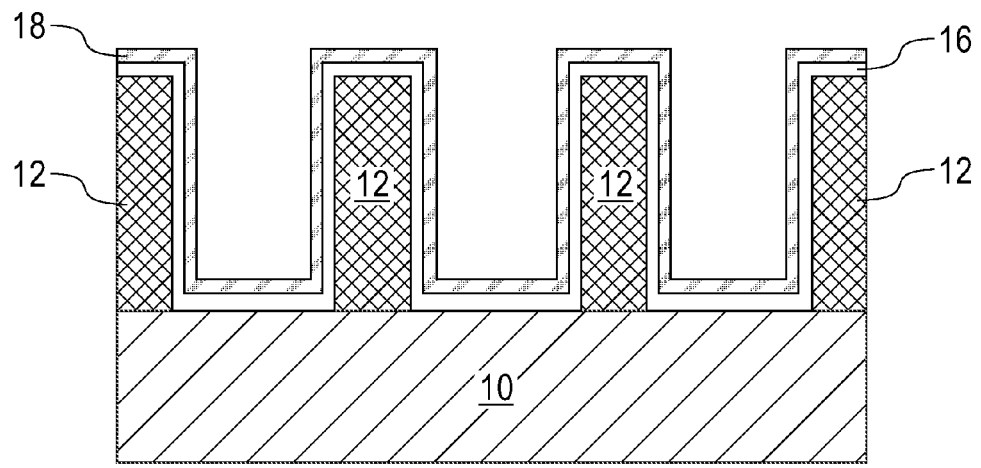
FIG. 2 is a cross sectional view of the exemplary semiconductor structure of FIG. 1 after forming a diffusion barrier material and a reflow enhancement layer.

Referring now to FIG. 2, there is illustrated the exemplary semiconductor structure of FIG. 1 after forming a diffusion barrier material 16 and a reflow enhancement layer 18. As is shown, the diffusion barrier material 16 is formed as a continuous layer on the exposed topmost surface of the MOL dielectric material layer 12 and along the sidewall surfaces, s1, and bottommost surface of each opening 14. The reflow enhancement layer 18 is a continuous layer that is formed on the diffusion barrier material 16.

The diffusion barrier material 16 includes Ta, TaN, Ti, TiN, Ru, RuN, RuTa, RuTaN, W, WN or any other material that can serve as a barrier to prevent a conductive material such as cobalt from diffusing there through. In some embodiments, the diffusion barrier material may include a material stack of such diffusion barrier materials. In one example, the diffusion barrier may be composed of a stack of Ta/TaN.

The thickness of the diffusion barrier material 16 may vary depending on the deposition process used as well as the material employed. In some embodiments, the diffusion barrier material 16 may have a thickness from 2 nm to 50 nm; although other thicknesses for the diffusion barrier material 16 are contemplated and can be employed in the present application. The diffusion barrier material 16 can be formed by a deposition process including, for example, chemical vapor deposition (CVD), plasma enhanced chemical vapor deposition (PECVD), atomic layer deposition (ALD), physical vapor deposition (PVD), sputtering, chemical solution deposition or plating.

The reflow enhancement layer 18 is then formed on the diffusion barrier material 16. The reflow enhancement layer 18 includes any metal or metal alloy that facilities in the movement (i.e., flow) of another deposited metal or metal alloy that differs in composition from the reflow enhancement layer 18 during a subsequently performed reflow anneal process. Examples of metals or metal alloys that may be employed as the reflow enhancement layer 18 include ruthenium, iridium, a tantalum-iridium alloy, a niobium-ruthenium alloy and a niobium-iridium alloy. In one embodiment and when a layer of cobalt is to be subsequently formed and reflowed, the reflow enhancement layer 18 is composed of ruthenium or iridium.

The thickness of reflow enhancement layer 18 may vary depending on the material of the reflow enhancement layer 18 as well as the technique used in forming the same. Typically, the reflow enhancement layer 18 has a thickness from 2 nm to 80 nm. The reflow enhancement layer 18 can be formed by a conventional deposition process including, for example, CVD, PECVD, ALD, or PVD.

It is noted that the total thickness of the diffusion barrier material 16 and the reflow enhancement layer 18 is insufficient to completely fill the total volume of each opening 14. Thus, a portion (i.e., a volume) of each opening 14 is available for further processing.

Figure 3:
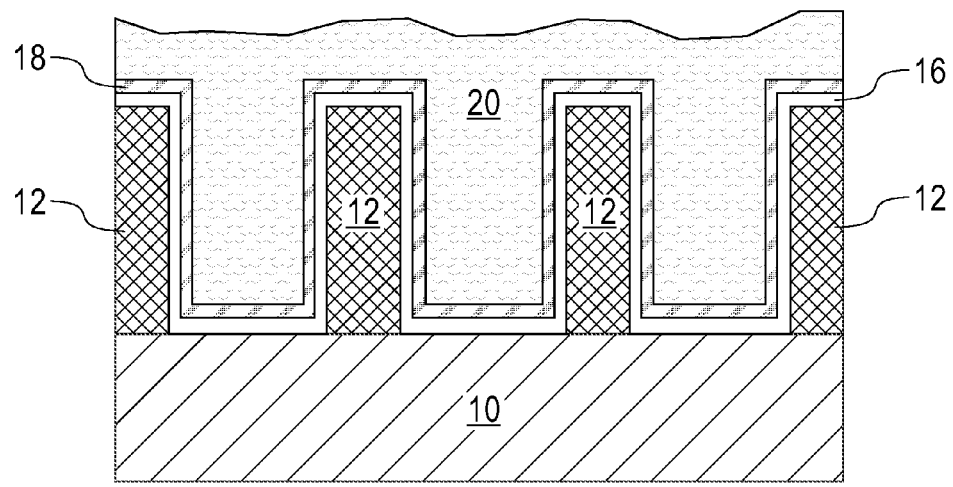
FIG. 3 is a cross sectional view of the exemplary semiconductor structure of FIG. 2 after depositing a layer of a contact metal or metal alloy and performing a reflow anneal.

Referring now to FIG. 3, there is illustrated the exemplary semiconductor structure of FIG. 2 after depositing a layer of contact metal or metal alloy and performing a reflow anneal. In FIG. 3, element 20 denotes the deposited and reflowed layer of contact metal or metal alloy. As is shown, the deposited and reflowed layer of contact metal or metal alloy 20 completely fills in the remaining portion (i.e., volume) of each opening 14; an overburden portion of the deposited and reflowed layer of contact metal or metal alloy 20 forms outside each opening 14 and above the topmost surface of the MOL dielectric material layer 12.

The deposited and reflowed layer of contact metal or metal alloy 20 is formed by first depositing a contact metal or metal alloy directly on the reflow enhancement layer 18 and then performing a reflow anneal. The contact metal or metal alloy that may be employed in the present application includes cobalt (Co), platinum, (Pt), and/or nickel (Ni). The contact metal or metal alloy can be formed by a deposition process including PVD, chemical vapor deposition (CVD), plasma enhanced chemical vapor deposition (PECVD), sputtering, chemical solution deposition or plating.

Next, a reflow anneal is performed. In one embodiment of the present application, the reflow anneal is a thermal anneal. In one example, the reflow anneal may include a furnace anneal or a hot plate anneal. The reflow anneal may be performed at a temperature from 100° C. to 500° C. Other temperatures can also be employed so long as the selected reflow anneal temperature causes the reflow of the contact metal or metal alloy. The duration of the reflow anneal may vary depending upon the temperature used during the thermal anneal. In one embodiment and for a temperature from 100° C. to 500° C., the reflow anneal may be performed for a duration of 20 minutes to 3 hours.

The reflow anneal is typically performed in a nitrogen-containing ambient or a hydrogen-containing ambient. The nitrogen-containing ambients that can be employed in the present application include, but are not limited to, $N_2$, or $NH_3$, and mixtures thereof. In some embodiments, the nitrogen-containing ambient is used neat, i.e., non-diluted. In other embodiments, the nitrogen-containing ambient can be diluted with an inert gas such as, for example, He, Ne, Ar and mixtures thereof. In some embodiments, $H_2$ can be used to dilute the nitrogen-containing ambient. Notwithstanding whether the nitrogen-containing ambient is employed neat or diluted, the content of nitrogen within the nitrogen-containing ambient employed in the present application is typically from 10% to 100%, with a nitrogen content within the nitrogen-containing ambient from 50% to 80% being more typical.

Figure 4:
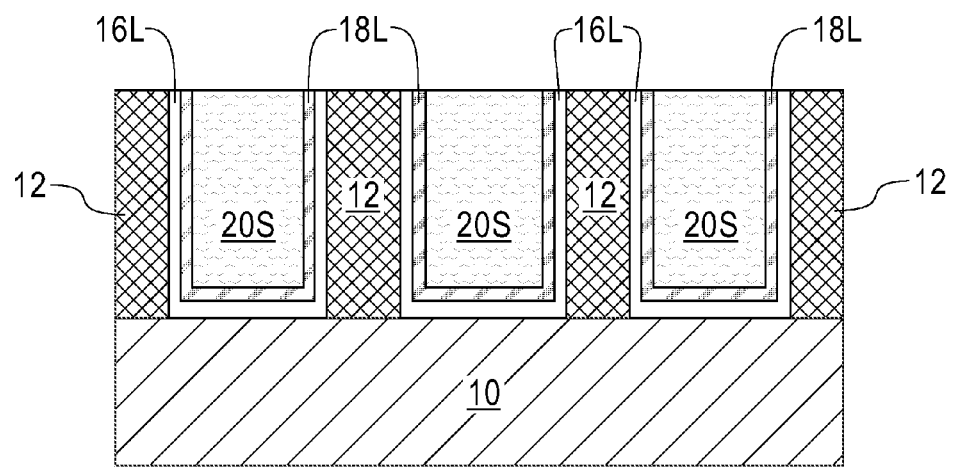
FIG. 4 is a cross sectional view of the exemplary semiconductor structure of FIG. 3 after performing a planarization process.

Referring now to FIG. 4, there is illustrated the exemplary semiconductor structure of FIG. 3 after performing a planarization process. The planarization process removes portions of the deposited and reflowed layer of contact metal or metal alloy 20, portions of the reflow enhancement layer 18, and portions of the diffusion barrier material 16 that are present outside each opening 14. Planarization may be performed utilizing chemical mechanical polishing and/or grinding.

After planarization, a portion of the deposited and reflowed layer of contact metal or metal alloy 20, a portion of the reflow enhancement layer 18, and a portion of the diffusion barrier material 16 remain within each opening 14. Each remaining portion of the deposited and reflowed layer of contact metal or metal alloy 20 can be referred to as a metallization structure 20S. Each remaining portion of the reflow enhancement layer 18 can be referred to herein as a reflow enhancement liner 18L, and each remaining portion of the diffusion barrier material 16 may be referred to herein as a diffusion barrier liner 16L. As is shown, topmost surfaces of each of the metallization structure 20S, the reflow enhancement liner 18L, and the diffusion barrier liner 16L that are present in each opening 14 are coplanar with each other as well as being coplanar with a topmost surface of the MOL dielectric material layer 12.

As shown in FIG. 4, the reflow enhancement liner 18L located in each opening 14 that is present in a dielectric-containing substrate (i.e., the MOL dielectric material 12). The reflow enhancement liner 18L is U-shape. By "U-shaped" it is meant a material has a horizontal portion and two vertical portions extending from opposite ends of the horizontal portion. The diffusion barrier liner 16L that is present beneath the reflow enhancement liner 18L is also U-shaped. In this embodiment, metallization structure 20S is located on the horizontal portion of the reflow enhancement liner 18L and the metallization structure 20S completely fills a volume located between the two vertical portions of the reflow enhancement liner 18L.

Figure 5:
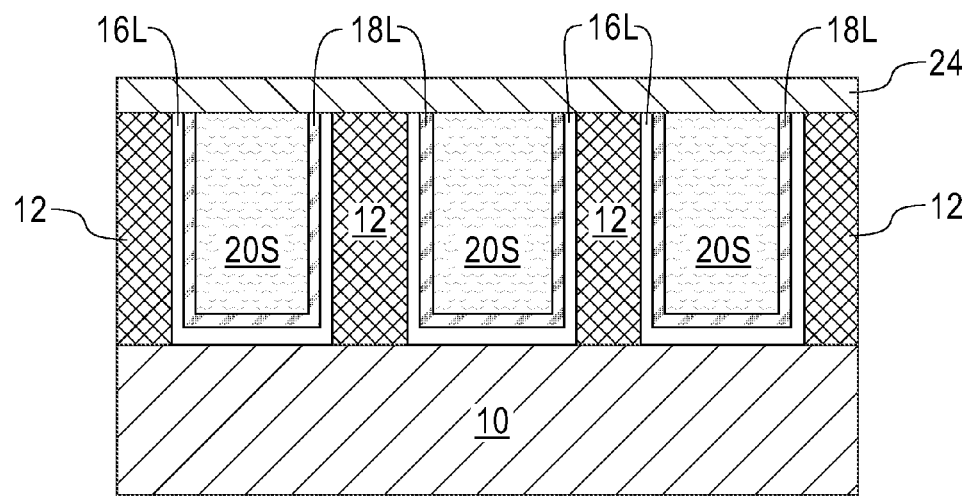
FIG. 5 is a cross sectional view of the exemplary semiconductor structure of FIG. 4 after forming a cap on exposed surfaces of the planarized structure.

Referring now to FIG. 5, there is illustrated the exemplary semiconductor structure of FIG. 4 after forming a cap 24 on exposed surfaces of the planarized structure. Cap 24 is formed on topmost surfaces of each metallization structure 20S, each reflow enhancement liner 18L, each diffusion barrier liner 16L and atop the topmost surface of the MOL dielectric material layer 12.

In some embodiments of the present application, cap 24 is composed of a dielectric capping material such as, for example, SiC, $Si_3N_4$, $SiO_2$, a carbon doped oxide, a nitrogen and hydrogen doped silicon carbide SiC(N,H) or multilayers thereof. In other embodiments, cap 24 may be composed of a metal cap such as, for example, CoWP. The cap 24 can be formed utilizing a conventional deposition process such as, for example, chemical vapor deposition, plasma enhanced chemical vapor deposition, chemical solution deposition, evaporation, or atomic layer deposition. The thickness of the cap 24 may vary depending on the technique used to form the same as well as the material make-up of the layer. Typically, the cap 24 has a thickness from 15 nm to 100 nm. Other thicknesses that are lesser than 15 nm, or greater 100 nm may also be employed as the thickness of the cap 24.

Figure 6:
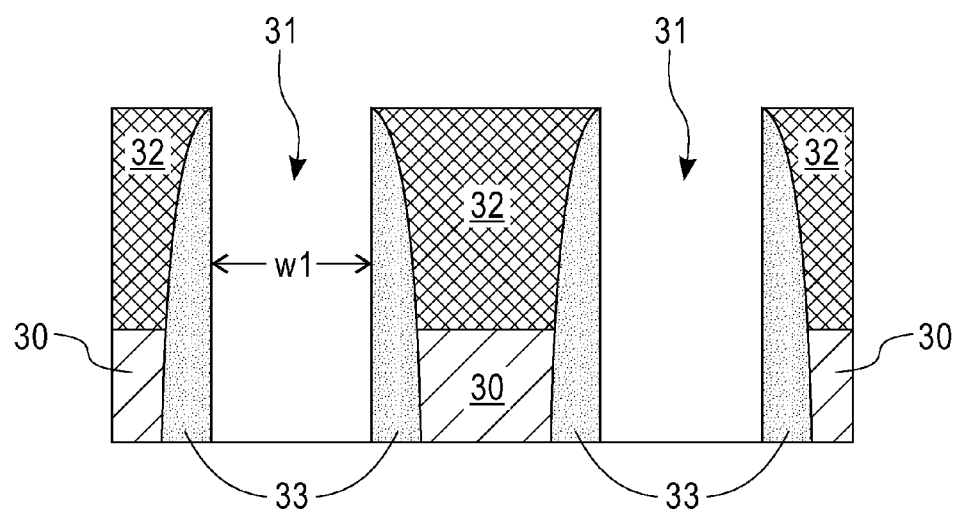
FIG. 6 is a cross sectional view of another exemplary semiconductor structure including at least one gate cavity surrounded by a dielectric spacer and a middle-of-the line (MOL) dielectric material layer.

Referring now to FIG. 6, there is illustrated another exemplary semiconductor structure including at least one gate cavity 31 surrounded by a dielectric spacer 33 and a middle-of-the line (MOL) dielectric material layer 32. The exemplary semiconductor structure also includes at least one semiconductor fin 30. The at least one semiconductor fin 30 may include any semiconductor material such as, for example, silicon. In this embodiment, two gate cavities are shown by way of an example. In such an embodiment, one of the gate cavities can be a region in which a nFET device can be subsequently formed, and the other gate cavity may be a region in which a pFET device region can be subsequently formed. In the illustrated embodiment, each gate cavity 31 is shown between two semiconductor fins 30.

In the exemplary semiconductor structure shown in FIG. 6, each gate cavity 31 may be referred to as an opening. Each gate cavity 31 may have a constant width, w1, and sidewall surfaces that are perpendicular to the at least one semiconductor fin 30.

The exemplary semiconductor structure shown in FIG. 6 can be formed by first providing a semiconductor substrate. The at least one semiconductor fin 30 can then be formed by patterning an upper semiconductor material portion of the semiconductor substrate. At least one sacrificial gate structure (not shown) can then be formed by depositing a sacrificial gate material and thereafter patterning the sacrificial gate material. After formation of the at least one sacrificial gate structure, dielectric spacers 33 can be formed on exposed sidewall surfaces of the at least one sacrificial gate structure utilizing a deposition process and etching. The dielectric spacers 33 may be composed of any dielectric spacer material such as, for example, silicon dioxide or silicon nitride. Next, the MOL dielectric material layer 32 is formed. The MOL dielectric material layer 32 of this embodiment may include one of the dielectric materials mentioned above for the MOL dielectric material layer 12 in the previous embodiment of the present application. The MOL dielectric material layer 32 can be formed utilizing one of the techniques described above in providing MOL dielectric material layer 12. In this embodiment, MOL dielectric material layer 32 has a topmost surface that is coplanar with a topmost surface of the at least one sacrificial gate structure. The at least one sacrificial gate structure is then removed by utilizing an anisotropic etch so as to provide the gate cavities 31 shown in FIG. 6.

Figure 7:
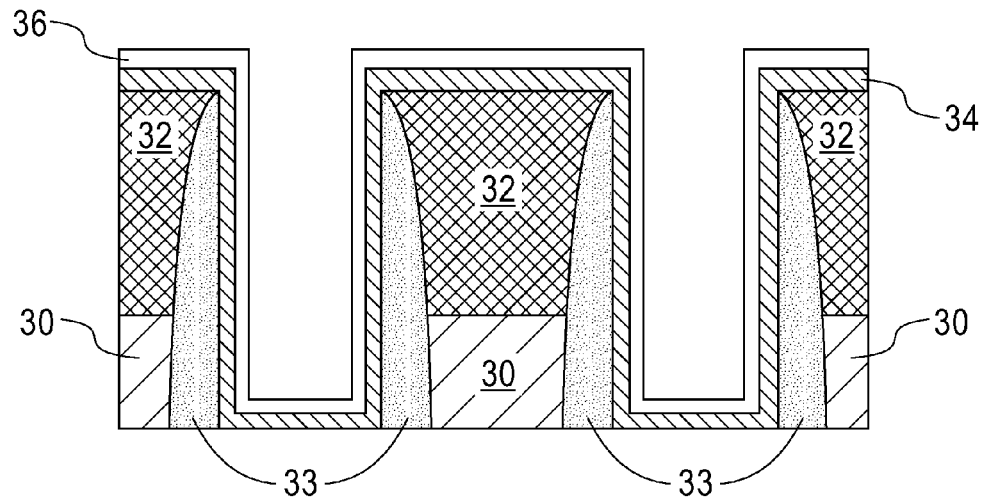
FIG. 7 is a cross sectional view of the exemplary semiconductor structure of FIG. 8 after forming a gate dielectric material and a work function metal at least within each gate cavity.
Figure 8:
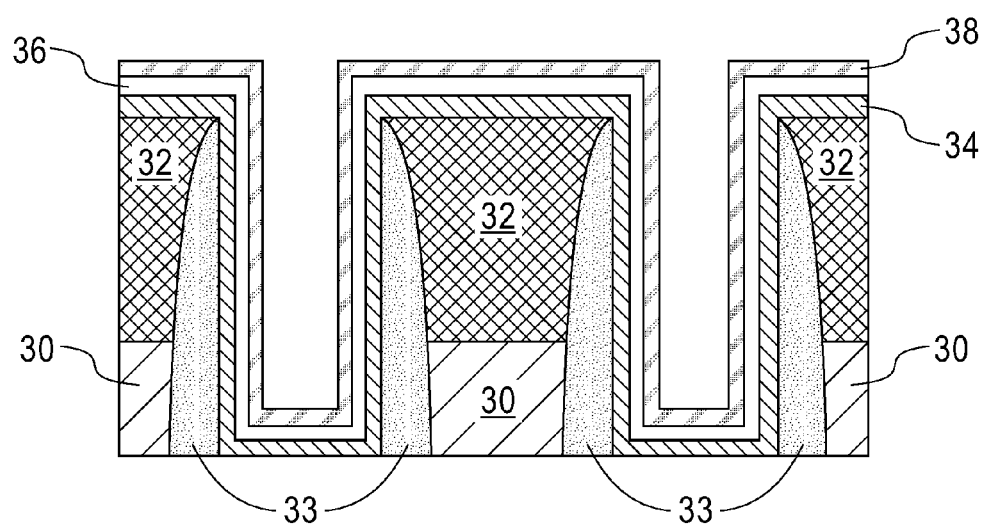
FIG. 8 is a cross sectional view of the exemplary semiconductor structure of FIG. 7 after forming a reflow enhancement layer on the work function metal.

Referring now to FIG. 7, there is illustrated the exemplary semiconductor structure of FIG. 8 after forming a gate dielectric material 34 and work function metal 36 at least within each gate cavity 31. The gate dielectric material 34 and the work function metal 36 are continuous layers that are formed one atop the other. Both the gate dielectric material 34 and the work function metal 36 include portions outside of, as well as within, each gate cavity 31.

The gate dielectric material 34 can be an oxide, nitride, and/or oxynitride. In one example, the gate dielectric material 34 can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multi-layered gate dielectric structure comprising different gate dielectric materials, e.g., silicon dioxide, and a high-k gate dielectric can be formed and used as the gate dielectric material 34.

The gate dielectric material 34 can be formed by any deposition process including, for example, chemical vapor deposition (CVD), plasma enhanced chemical vapor deposition (PECVD), physical vapor deposition (PVD), sputtering, or atomic layer deposition. In one embodiment of the present application, the gate dielectric material 34 can have a thickness in a range from 1 nm to 10 nm. Other thicknesses that are lesser than, or greater than, the aforementioned thickness range can also be employed for the gate dielectric material 34.

The work function metal 36 may be composed of, for example, aluminum, lanthanum oxide, magnesium oxide, strontium titanate, tantalum carbide, titanium nitride, and strontium oxide. The work function metal 36 may have a thickness ranging from 0.5 nm to 50 nm, though greater and lesser thickness are explicitly contemplated. The combined thickness of the gate dielectric material 34 and the work function metal 36 is insufficient to fill the entirety of the gate cavities 31. The work function metal 36 may be formed by any suitable deposition technique, such as, but not limited to, atomic layer deposition (ALD), chemical vapor deposition (CVD), physical vapor deposition (PVD), molecular beam deposition (MBD), pulsed laser deposition (PLD), or liquid source misted chemical deposition (LSMCD), sputtering, or plating.

Referring now to FIG. 8, there is illustrated the exemplary semiconductor structure of FIG. 7 after forming a reflow enhancement layer 38 on the work function metal 36. The flow enhancement layer 38 of this embodiment is a continuous layer.

The reflow enhancement layer 38 includes any metal or metal alloy that facilities in the movement (i.e., flow) of another deposited metal or metal alloy that differs in composition from the reflow enhancement layer during a subsequently performed reflow anneal process. Examples of metals or metal alloys that may be employed as the reflow enhancement layer 38 include ruthenium, iridium, a tantalum-iridium alloy, a niobium-ruthenium alloy and a niobium-iridium alloy. In one embodiment and when a layer of cobalt is to be subsequently formed and reflowed, the reflow enhancement layer 38 is composed of ruthenium or iridium.

The thickness of reflow enhancement layer 38 may vary depending on the material of the reflow enhancement layer 38 as well as the technique used in forming the same. Typically, the reflow enhancement layer 38 has a thickness from 2 nm to 80 nm. The reflow enhancement layer 38 can be formed by a conventional deposition process including, for example, CVD, PECVD, ALD, or PVD.

It is noted that the total thickness of the gate dielectric material 34, the work function metal 36 and the reflow enhancement layer 38 is insufficient to completely fill the total volume of each of the gate cavities 31. Thus, a portion (i.e., a volume) of each gate cavity 31 is available for further processing.

Figure 9:
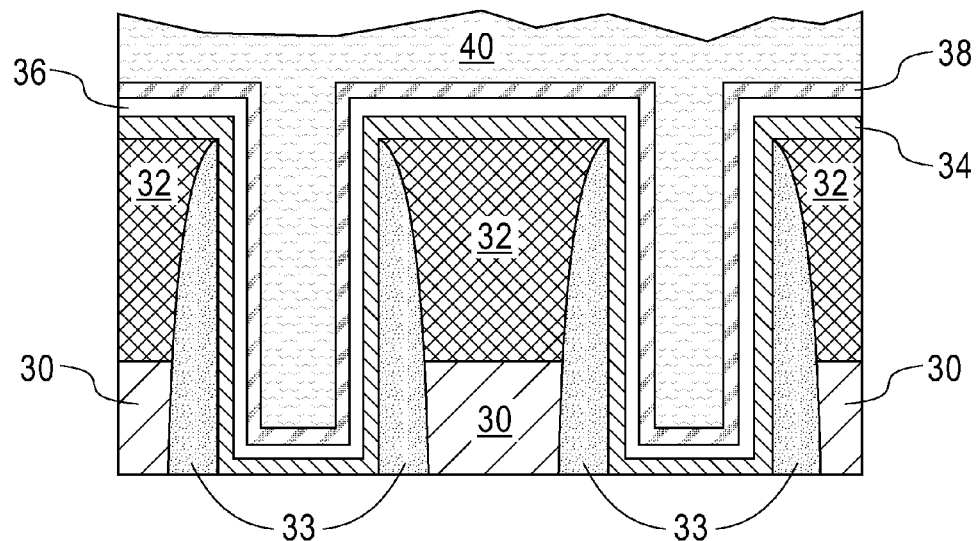
FIG. 9 is a cross sectional view of the exemplary semiconductor structure of FIG. 8 after depositing a layer of a contact metal or metal alloy and performing a reflow anneal.

Referring now to FIG. 9, there is illustrated the exemplary semiconductor structure of FIG. 8 after depositing a layer of a contact metal or metal alloy and performing a reflow anneal. In FIG. 9, element 40 denotes the deposited and reflowed layer of contact metal or metal alloy. As such shown, the deposited and reflowed layer of contact metal or metal alloy 40 completely fills in the remaining portion (i.e., volume) of each gate cavity 31; an overburden portion of the deposited and reflowed layer of contact metal or metal alloy 40 forms outside each gate cavity 31 and above the topmost surface of the MOL dielectric material layer 32.

The deposited and reflowed layer of contact metal or metal alloy 40 is formed by first depositing a contact metal or metal alloy directly on the reflow enhancement layer 38 and then performing a reflow anneal. The contact metal or metal alloy that may be employed in the present application includes cobalt (Co), platinum, (Pt), and/or nickel (Ni). The contact metal or metal alloy can be formed by a deposition process including PVD, chemical vapor deposition (CVD), plasma enhanced chemical vapor deposition (PECVD), sputtering, chemical solution deposition or plating.

Next, a reflow anneal is performed. The reflow anneal of this embodiment of the present application is the same as described in the previous embodiment of the present application.

Figure 10:
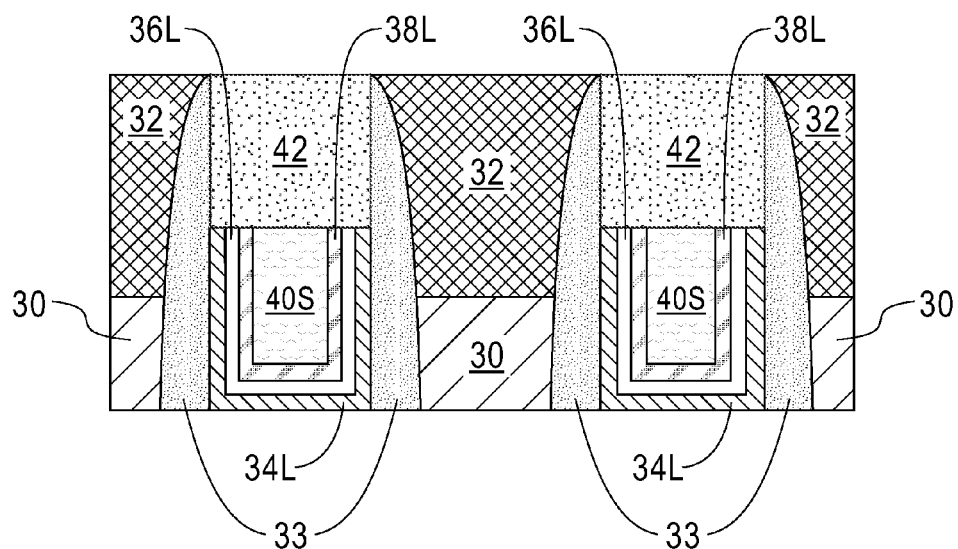
FIG. 10 is a cross sectional view of the exemplary semiconductor structure of FIG. 9 after performing a planarization process, recessing and formation of a cap.

Referring now to FIG. 10, there is illustrated the exemplary semiconductor structure of FIG. 9 after performing a planarization process, recessing and formation of a cap 42. The planarization process of this embodiment of the present application includes chemical mechanical polishing and/or grinding. The planarization process removes all material (i.e., portions of elements 40, 38, 36 and 34) that is outside each gate cavity 31 and atop the topmost surface of the MOL dielectric material 32. Portions of elements 40, 38, 36 and 34 remain in each of the gate cavities 31. Next, a recess etch is performed to remove elements 40, 38, 36 and 34 from an upper portion of each gate cavity 31. Portions of elements 40, 38, 36 and 34 remain in the lower portion of each gate cavity 31. The remaining portion of the deposited and reflowed layer of contact metal or metal alloy 40 can now be referred to as a metallization structure 40S. The remaining portion of the reflow enhancement layer 38 can now be referred to a reflow enhancement liner 38L. The remaining portion of the work function metal 36 can now be referred to as a work function portion 36L. The remaining portion of the gate dielectric material can be referred to as a gate dielectric portion 34L. As is shown, the topmost surface of each of the metallization structure 40S, the reflow enhancement liner 38L, the work function portion 36L and the gate dielectric portion 34L are coplanar with each other.

As shown in FIG. 10, the reflow enhancement liner 38L is located in a lower portion of each gate cavity 31 that is present in a dielectric-containing substrate (i.e., the dielectric spacer 33). The reflow enhancement liner 38L is U-shape. The gate dielectric portion 34L and the work function metal portion 36L that are present beneath the reflow enhancement liner 38L are also U-shaped. In this embodiment, metallization structure 40S is located on the horizontal portion of the reflow enhancement liner 38L and the metallization structure 40S completely fills a volume located between the two vertical portions of the reflow enhancement liner 38L.

Cap 42 is then formed in the upper portion of each gate cavity 31. Cap 42 of this embodiment of the present application may include one of the materials mentioned above for cap 24. Cap 42 can be formed utilizing a deposition process as described above for providing cap 24. A planarization process may be used to complete the formation of cap 42.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure, the method comprising:
    providing an opening in a dielectric-containing substrate;
    forming a reflow enhancement layer in the opening and atop the dielectric-containing substrate;
    forming a layer of a contact metal or metal alloy on the reflow enhancement layer;
    performing a reflow anneal to completely fill a remaining volume of the opening with the contact metal or metal alloy of the layer of contact metal or metal alloy; and
    removing the layer of contact metal or metal alloy, and the reflow enhancement layer located outside of the opening, wherein a portion of the layer of contact metal or metal alloy, and a portion of the reflow enhancement layer remain within the opening, and wherein the portion of the layer of contact metal or metal alloy that remains in the opening has a sidewall that is in direct physical contact with an inner sidewall of the portion of the reflow enhancement layer that remains in the opening.

2. The method of claim 1, wherein the remaining portion of the reflow enhancement layer and the remaining portion of the layer of contact metal or metal alloy have topmost surfaces that are coplanar with each other and are located entirely within the opening.

3. The method of claim 1, wherein the removing the layer of contact metal or metal alloy, and the reflow enhancement layer outside of the opening comprises a planarization process.

4. The method of claim 1, wherein prior to forming the reflow enhancement layer, a diffusion barrier layer is formed in the opening and atop the dielectric-containing structure.

5. The method of claim 1, wherein the reflow anneal is a thermal anneal performed in a nitrogen-containing ambient and at a temperature from 100° C. to 500° C.

6. The method of claim 1, wherein the reflow enhancement layer is of a different composition than the layer of contact metal or metal alloy.

7. The method of claim 1, wherein the dielectric-containing structure is composed entirely of a middle-of-the-line dielectric material layer.

8. The method of claim 1, wherein the opening physically exposes a portion of a topmost surface of a substrate.

9. The method of claim 1, wherein prior to forming the reflow enhancement layer, a material stack of a gate dielectric material and a work function metal is formed in the opening and atop the dielectric-containing structure.

10. The method of claim 9, wherein the dielectric-containing structure contains dielectric spacers located at sidewalls of the opening.

11. The method of claim 1, wherein the layer of contact metal or metal alloy comprises cobalt.

12. The method of claim 11, wherein the reflow enhancement layer is composed of a metal or metal alloy selected from the group consisting of ruthenium, iridium, a tantalum-iridium alloy, a niobium-ruthenium alloy and a niobium-iridium alloy.

13. A method of forming a semiconductor structure, the method comprising:
    providing a gate cavity in a material stack of, from bottom to top, a semiconductor fin and a middle-of-the-line (MOL) dielectric material, wherein sidewalls of the gate cavity are entirely lined with a dielectric spacer;
    forming a gate dielectric material in the gate cavity and on each dielectric spacer and the MOL dielectric material;
    forming a work function metal on the gate dielectric material;
    forming a reflow enhancement layer on the work function metal;
    forming a layer of a contact metal or metal alloy on the reflow enhancement layer;
    performing a reflow anneal to completely fill a remaining volume of the gate cavity with the contact metal or metal alloy of the layer of contact metal or metal alloy; and
    removing the layer of contact metal or metal alloy, the reflow enhancement layer, the work function metal and the gate dielectric material located outside of the gate cavity, wherein a portion of the layer of contact metal or metal alloy, a portion of the reflow enhancement layer, a portion of the work function metal, and a portion of the gate dielectric material remain within the gate cavity, and wherein the portion of the layer of contact metal or metal alloy that remains in the gate cavity has a sidewall that is in direct physical contact with an inner sidewall of the portion of the reflow enhancement layer that remains in the gate cavity.

14. The method of claim 13, wherein the reflow anneal is a thermal anneal performed in a nitrogen-containing ambient and at a temperature from 100° C. to 500° C.

15. The method of claim 13, wherein the portion of the layer of contact metal or metal alloy, the portion of the reflow enhancement layer, the portion of the work function metal, and the portion of the gate dielectric material that remain within the gate cavity have topmost surfaces that are coplanar with each other.

16. The method of claim 15, wherein the topmost surfaces of the portion of the layer of contact metal or metal alloy, the portion of the reflow enhancement layer, the portion of the work function metal, and the portion of the gate dielectric material that remain within the gate cavity are located beneath a topmost surface of the MOL dielectric material.

17. The method of claim 16, further comprising forming a gate cap on the topmost surfaces of the portion of the layer of contact metal or metal alloy, the portion of the reflow enhancement layer, the portion of the work function metal, and the portion of the gate dielectric material that remain within the gate cavity.

18. The method of claim 13, wherein the reflow enhancement layer is of a different composition than the layer of contact metal or metal alloy.

19. The method of claim 18, wherein the layer of contact metal or metal alloy comprises cobalt.

20. The method of claim 19, wherein the reflow enhancement layer is composed of a metal or metal alloy selected from the group consisting of ruthenium, iridium, a tantalum-iridium alloy, a niobium-ruthenium alloy and a niobium-iridium alloy.

* * * * *